United States Patent [19]
Edelstein

[11] Patent Number: 5,186,854
[45] Date of Patent: Feb. 16, 1993

[54] COMPOSITES HAVING HIGH MAGNETIC PERMEABILITY AND METHOD OF MAKING

[75] Inventor: Alan S. Edelstein, Alexandria, Va.

[73] Assignee: The United States of America as represented by the Secretary of the Navy, Washington, D.C.

[21] Appl. No.: 526,259

[22] Filed: May 21, 1990

[51] Int. Cl.$^5$ .................... C04B 35/26; C23C 14/34
[52] U.S. Cl. ................ 252/62.55; 252/62.56; 204/192.2; 360/131
[58] Field of Search ............ 252/62.55, 62.56; 204/192.2; 360/131

[56] References Cited

U.S. PATENT DOCUMENTS

| | | | |
|---|---|---|---|
| 3,234,487 | 2/1966 | Ebert | 333/22 |
| 3,748,270 | 7/1973 | Hwange et al. | 252/62.56 |
| 3,829,372 | 8/1974 | Heller | 204/192.2 |
| 3,974,246 | 8/1976 | Chen et al. | 264/24 |
| 3,996,095 | 12/1976 | Ahn et al. | 204/192.2 X |
| 4,013,534 | 3/1977 | Ishii et al. | 204/192.2 |
| 4,215,158 | 7/1980 | Hattori et al. | 204/192.2 X |
| 4,232,061 | 11/1980 | Hattori et al. | 204/192.2 X |
| 4,282,302 | 8/1981 | Makino et al. | 252/62.56 X |
| 4,485,085 | 11/1984 | David et al. | 252/62.56 X |
| 4,520,040 | 5/1985 | Cordts | 204/192.2 X |
| 4,538,151 | 8/1985 | Hatakeyama et al. | 343/18 |
| 4,543,197 | 9/1985 | Karasawa et al. | 252/62.56 |
| 4,626,370 | 12/1986 | Wakayama et al. | 252/62.52 |
| 4,664,831 | 5/1987 | Hibst et al. | 252/62.56 X |
| 4,808,327 | 2/1989 | Rousset et al. | 252/62.56 |
| 4,865,709 | 9/1989 | Nakagawa et al. | 204/192.12 |

OTHER PUBLICATIONS

Enhanced Magnetic Anisotropy at the Percolation Threshold of Fe-SiO$_2$ Composite Thin Films, R. L. Holtz et al., Appl. Phys. Lett. 56, Mar. 5, 1990.
Granular Metal Films as Recording Media, S. H. Liou et al., Department of Physics and Astronomy, The Johns Hopkins University, Baltimore, Md., Oct. '87.
Iron-Iron Oxide Layer Films, R. R. Ruf et al., J. Appl. Phys. 55, Mar. 15, 1984.
High Magnetization Films with Low Eddy Current Losses, R. J. Gambino et al. IBM Tech. Disclosure Bulletin, vol. 26, No. 12, pp. 6348-6349 (May 1984).
Phase-Separated Fe and Co Particles in a BN Matrix, A. S. Edelstein et al. J. Appl. Phys. 61, Apr. 15, 1987.
Amorphous Iron Particles In Cosputtered Fe-SiO$_2$ Films, R. L. Holtz et al. J. Appl. Phys. 64, Oct. 15, 1988.

*Primary Examiner*—Nam X. Nguyen
*Attorney, Agent, or Firm*—Thomas E. McDonnell; Barry A. Edelberg

[57] ABSTRACT

A ferromagnetic metal/ceramic composite comprising particles of ferromagnetic metal embedded within an insulating ceramic has high electrical resistivity and high saturation magnetization. The composite is prepared by sputtering in a mixture of a nonreactive gas with a reactive gas, followed by annealing.

20 Claims, No Drawings

COMPOSITES HAVING HIGH MAGNETIC PERMEABILITY AND METHOD OF MAKING

BACKGROUND OF THE INVENTION

1. Field of the Invention

This invention relates to a novel ceramic composite material having high magnetic saturation magnetization. More specifically, it is directed to a ferromagnetic metal/ceramic composite having high electrical resistivity and high saturation magnetization for use in self-inductance coils, transformers, tuners and filters and magnetic recording media.

2. Description of the Prior Art

Ferrites of the general formula $MA_2O_4$, M being a divalent metal such as Mg, Mn, Fe, Co, Ni or Cu, and A being a ferromagnetic metal, such as Fe, Co or Mn, are used in self-inductance coils, transformers, tuners, filters and magnetic recording media. In such materials, a high electrical resistivity is required since it provides for low induced eddy currents and low heat dissipation when a high-frequency alternating magnetic field is imposed. A high saturation magnetization, on the other hand, is desirable since it provides high magnetic flux densities, high magnetic coupling between transformer primary and secondary windings and high self-inductance with a small amount of magnetic core material, making it possible to achieve desired electric circuit characteristics with small components. Furthermore, a high Curie temperature is desirable since it allows operation of such components at elevated temperature without loss of desirable high magnetic permeability.

Iron particles dispersed in a silica matrix, and iron and cobalt particles dispersed in a boron nitride matrix, have been produced by a process referred to as sputtering (J.Appl.Phys. 64(8) 1988 and J.Appl.Phys. 61(8) 1987).

U.S. Pat. No. 3,234,487 discloses a waveguide section for dissipating microwave energy made of iron powder dispersed in glass, made by mixing iron powder and powdered glass and sintering.

U.S. Pat. No. 3,748,270 discloses cobalt-doped magnetic iron oxide prepared by mixing alpha-hematite or alpha-ferric hydroxide with a cobalt oxide or a cobalt salt, heat treating the mixture, and cooling in an inert atmosphere.

U.S. Pat. No. 3,974,246 discloses cobalt-substituted magnetite subjected to a magnetic field and annealed to improve the magnetic properties of the material.

U.S. Pat. No. 4,538,151 discloses a material for absorption of microwave energy having short fibers of metal or metal alloy and ferrite particles embedded in a matrix of an organic polymer such as polyethylene or polybutadiene.

U.S. Pat. No. 4,543,197 discloses magnetic ferrites of Fe, Mn, Ni, Cu, Mg, Zn or Co prepared by mixing a ferroalloy and metal oxide powder in water, ventilating with air to oxidize the ferroalloy to metal oxides, drying and heat treating.

U.S Pat. No. 4,626,370 discloses a magnetic fluid comprising fine iron particles dispersed in a phospholipid such as lecithin, alkyl esters of dicarboxylic acids, and an antioxidant such as d,l-alpha-tocopherol (vitamin E).

U.S. Pat. No. 4,865,709 discloses a magnetron sputter apparatus for forming a film of powder under vacuum by exposing a target material having a geometry designed to optimize film formation and uniformity of film thickness to sputtering.

SUMMARY OF THE INVENTION

It is an object of this invention to produce ferromagnetic metal/ceramic composites having improved electromagnetic properties.

It is a further object of this invention to provide methods of preparing ferromagnetic metal/ceramic composites.

These and other objects have been achieved by using sputtering techniques to prepare ferromagnetic metal/ceramic composites comprising small particles of ferromagnetic metal embedded in an insulating ceramic matrix nonreactive with the ferromagnetic metal. These ferromagnetic metal/ceramic composites have magnetic and electric properties substantially superior to those of conventional ferromagnetic metal/ceramic composites.

DESCRIPTION OF THE PREFERRED EMBODIMENT

The ferromagnetic metal/ceramic composites of the present invention comprise a ceramic, insulating matrix, such as $SiO_2$ or a ferrite, with a ferromagnetic metal which is nonreactive with (i.e., naturally phase separates from) the ceramic matrix. Ceramics other than oxides may also be used as the matrix material.

The preferred embodiments according to the present invention have a matrix of the formula $MA_2O_4$, M being a divalent metal such as Mg, Mn, Fe, Co, Ni or Cu, and A being a ferromagnetic metal, such as Fe, Co or Mn. More preferred are embodiments having the formula $MFe_2O_4$, M being a divalent metal such as Mg, Mn, Fe, Co, Ni or Cu.

The most preferred embodiments of this invention comprise crystalline ferrous ferrite, $Fe_3O_4$ as a matrix with small particles of metallic iron embedded in it. Alternatively, the ferrous ferrite matrix may be amorphous. The iron particles are preferably at least about 10 Å. Typically, the particle size for iron ranges from about 10 Å to the size of a single magnetic domain in iron (usually about 5000 Å) and the volume fraction of iron particles in the ferrite-iron particle composite material ranges from 0.01 to 0.5 (preferably about 0.01 to 0.3 and most preferably about 0.01 to 0.2) volume fraction of Fe particles in $Fe_3O_4$. In these materials, it is found that when the volume fraction of metallic iron exceeds about 0.5, the electrical resistivity of the composite material drops sharply because the iron particles begin to form an electrical conduction path through the composite material. The preferred particle size range and composition for ferromagnetic metal/ceramic composites according to the present invention other than the above described iron/ferrous ferrite composite can be determined by analogy to the ferrous ferrite composites.

The electrical resistivity of the ferromagnetic metal/ceramic composites of the present invention can be increased by using a high resistivity matrix. For example the electrical resistivity of an iron/ferrous ferrite composite according to the present invention can be increased by replacing some or all of the $Fe_3O_4$ with $CuFe_2O_4$. $Fe_3O_4$ matrices having 5-10 percent by weight of $CuFe_2O_4$ have especially desirable resistivities.

A measure of the improvement in electromagnetic properties owing to the presence of ferromagnetic metal particles in composites according to the present invention is provided by the following table:

TABLE 1

|  | $Fe_3O_4$ | Present Invention |
|---|---|---|
| Volume fraction of Fe in ferrite | 0 | 0.2 |
| Electrical resistivity ohm-cm | ~1.0 | ~0.25 |
| Saturation magnetization, kGauss | 5.5 | 8.7 |
| Curie temperature | 838K | 838 to 1043K (838K for $Fe_3O_4$ and 1043K for Fe) |

Note that the present invention provides a 30% improvement in saturation magnetization.

The ferromagnetic metal/ceramic composites of this invention may prepared by various methods. For example the composites of this invention may be prepared using conventional sputtering techniques and under standard conditions for sputtering. For example, a plate of ferromagnetic metal, such as iron, referred to as the target, is placed in a chamber connected to a vacuum pump and fitted with a heated-filament cathode and an anode. If the ceramic matrix is to include a covalently bound metal (ferromagnetic or not; in the present specification and the claims that follow, the term "metal" includes Si) other than the one ferromagnetic metal, two targets or one target comprising the both the ferromagnetic metal and the additional metal may be used. The chamber is typically evacuated to at least $10^{-6}$, preferably to at least $10^{-7}$, mmHg absolute. Introduced into the chamber is a small flow of a non-reactive gas, such as argon or any rare gas, from a first source. A small flow of a reactive gas needed to react with the target and/or the additional metal to form the ceramic matrix is provided from a second source, and a negative voltage is applied to the heated-filament cathode and a positive voltage to the anode. Where the ceramic matrix is an oxide, the reactive gas is oxygen. The appropriate partial pressure of reactive gas can be empirically determined. The appropriate range of partial pressures required depends on the sputtering conditions, although the accompanying examples should provide sufficient guidance for those skilled in the art to practice the present invention using various sputtering conditions without undue experimentation. A plasma discharge is established between these electrodes near the target, and cations of the nonreactive gas formed in the plasma strike the target, releasing ions of the ferromagnetic metal from the target plate into the plasma. These ions deposit on the substrate, a section of the chamber wall, made of glass, as a thin film. Depending on the rate of supply of reactive gas, the ratio of the ferromagnetic metal to the additional metal, and the relative reactivities of the ferromagnetic metal and additional metal, a composite of the ferromagnetic metal embedded within a matrix of the reaction products of the ferromagnetic metal and/or the additional metal is produced. For example, using an iron plate as a target, oxygen as the reactive gas and no additional metal, then, depending on the rate of supply of oxygen to the chamber, metallic iron, a composite of Fe and $Fe_3O_4$, or $Fe_2O_3$ are deposited on the substrate. To produce the most preferred embodiment of the present invention, the supply of oxygen to the chamber is limited to produce an $Fe_3O_4$ matrix with a fraction of unoxidized metallic iron dispersed in it.

The adjustment of reactive gas flow rate to the chamber is, especially where the reactive gas is reactive with the ferromagnetic metal, most critical since an excessive reactive gas flow produces an abundance of ceramic material with no or insufficient ferromagnetic metal therein or can produce a ceramic of lower resistivity than desired. For example excessive oxygen flow may produce $Fe_3O_4$ with insufficient Fe in it, or no Fe at all, or mixtures of $Fe_3O_4$ and $Fe_2O_3$, or pure $Fe_2O_3$. Insufficient reactive gas flow produces ceramic with excessive ferromagnetic metal in it. For example insufficient oxygen flow may produce $Fe_3O_4$ with excessive metallic iron in it, which may have an objectionably low electrical resistivity due to the formation of an electrical conduction path through the material by the dispersed iron particles. As indicated above, in the most preferred materials according to the present invention, the volume fraction of metallic iron should not exceed 0.2.

As an example of the production of a ceramic having a covalently bound matrix metal other the elemental ferromagnetic metal embedded therein, the formation of ferrite containing a mixture of cuprous ferrite with ferrous ferrite, or entirely cuprous ferrite, is preferably accomplished by embedding a small metallic copper cylinder in the iron target plate and applying the sputtering process described above. The ratio of cuprous ferrite to ferrous ferrite in the product will vary predictably with the sputtering conditions and the relative sizes of the copper cylinder and iron plate. Similarly, a matrix comprising cuprous ferrite or a mixture thereof with ferrous ferrite can be produced by sputtering, preferably simultaneously, spatially separated iron and copper targets of appropriate size or a single target having comprising a mixture of iron and copper in appropriate ratios to achieve the desired ratio of cuprous ferrite to ferrous ferrite in the product.

After a film of the ferromagnetic metal/ceramic matrix composite having the desired thickness has been deposited on the substrate, the sputtering process is stopped by stopping the flow of nonreactive and reactive gases to the chamber and shutting off the voltages applied to the electrodes, releasing vacuum on the chamber, and removing the composite film from the substrate. The composite film is then annealed by heating, in an oven or similar device. In the case of iron/ferrite composites according the present invention, heating is done for from 5 to 60 minutes at 200° to 600° C., preferably for 30 minutes at 300 degrees Celsius. During this heat treatment, the smaller embedded ferromagnetic metal particles coalesce with larger ferromagnetic metal particles, leading ultimately to a particle size range from 100 to 1000 Angstrom units in the case of iron particles in a ferrite matrix.

Having described the invention, the following examples are given to illustrate specific applications of the invention including the best mode now known to perform the invention. These specific examples are not intended to limit the scope of the invention described in this application.

EXAMPLES

The Fe - $Fe_3O_4$ composites were produced by reactive sputtering of Fe in an argon-oxygen mixture which was then thermally treated after deposition to obtain the desired oxide phase. Into a Model 383 sputtering chamber supplied by L. M. Simard, Inc. of Santa Barbara, Calif., and referred to by the tradename TRI-MAG, is placed an iron plate 2.25" (57 mm) in diameter and 0.25" (6 mm) thick. Films were initially deposited onto quartz and glass substrates at 100.C by RF sputtering of a pure Fe source at a power of 500 W, using an argon pressure of 3.4 milliTorr and varying the partial pressures of oxygen up to 0.29 milliTorr. X-ray diffractometry on these as-deposited films showed only $\alpha$-Fe for oxygen partial pressures up to 0.16 milliTorr, a mixture of $\alpha$-Fe and FeO (wustite) from that pressure up to 0.21 milliTorr, and a mixture of FeO and $Fe_3O_4$ from 0.21 to 0.29 milliTorr. Post-deposition annealing at 300° C. for two hours in a vacuum of $5 \times 10^{-7}$ Torr or better converted all of the oxide-containing films to a mixture of $\alpha$-Fe and $Fe_3O_4$. The two hour annealing time was chosen arbitrarily and it was later determined that 30 minutes, and perhaps even 15 minutes, was sufficient. The volume fraction of $\alpha$-Fe, f, in the composites was estimated from the total atomic Fe weight density determined by x-ray fluorescence spectrometry and the known thickness deposition rates of pure Fe (approximately 35 nm/min) and pure $Fe_3O_4$ (approximately 54 nm/min) and assuming that the total thickness for 15 minute deposition times ranged from approximately 500 to 800 nm. Transmission electron microscopic (TEM) examination of a thinner (approximately 30 nm) film deposited onto a tungsten-supported carbon-film TEM grid with Fe volume fraction around 0.5 showed a polycrystalline microstructure, with average grain sizes of about 20 nm. The morphology is symmetric, there is no discernable difference in the structure and distribution of the Fe and $Fe_3O_4$ grains. The properties of the materials produced according to the present invention are compared to properties of $Fe_3O_4$ in Table 1.

While there has been described what at present is considered to be the preferred embodiment of this invention, it will be obvious to those skilled in the art that various changes and modifications may be made therein without departing from the invention and it is therefore intended to cover all such modifications and changes as fall within the spirit and scope of the invention.

What is claimed is:

1. A composite for magnetic applications comprising a matrix selected from the group consisting of ferrous ferrite, cuprous ferrite and mixtures thereof having embedded therein particles of metallic iron, said particles of metallic iron being present in said composite at a volume fraction of about 0.01 to about 0.5 and having a diameter ranging from about 10 to about 5000 Angstrom units, said composite having magnetically recorded information stored therein.

2. The composite of claim 1, wherein at least a portion of said matrix comprises ferrous ferrite.

3. The composite of claim 2, wherein said matrix comprises a mixture of ferrous ferrite and cuprous ferrite.

4. The composite of claim 2, wherein said matrix is composed entirely of ferrous ferrite.

5. The composite of claim 2, wherein said matrix is composed entirely of cuprous ferrite.

6. The composite of claim 5 wherein the ferrite matrix is amorphous.

7. The composite of claim 1, wherein at least a portion of said matrix comprises cuprous ferrite.

8. The composite according to claim 1 in which the ferrite matrix is crystalline and the particles of metallic iron have a volume fraction ranging from 0.01 to 0.3.

9. The composite according to claim 1 further containing 5-10 percent by weight of cuprous ferrite.

10. A composite having particles of metallic iron embedded in a matrix selected from the group consisting of ferrous ferrite, cuprous ferrite, and mixtures thereof, produced according to a method comprising the steps of:

sputtering at least one sputtering target comprising iron, at least one sputtering target comprising iron and copper, or both a copper sputtering target and an iron sputtering target, within a vacuum chamber having an atmosphere comprising nonreactive gas and an amount of oxygen effective to form, upon completion of said sputtering, a cuprous ferrite or ferrous ferrite matrix having embedded therein about 1 to 50 volume percent particles of metallic iron having a diameter ranging from about 10 to about 5000 Angstrom units;

annealing the composite of said sputtering; and magnetically recording information on said composite.

11. A composite having particles of metallic iron embedded in a matrix selected from the group consisting of ferrous ferrite, cuprous ferrite, and mixtures thereof, said particles being present in said composite at a volume fraction of about 0.01 to about 0.5 and having a diameter ranging from about 10 to about 5000 Angstrom units, produced according to a method comprising the steps of:

(a) placing into a chamber at least one sputtering target comprising iron, at least one sputtering target comprising iron and copper, or both a copper sputtering target and an iron sputtering target;

(b) evacuating said chamber;

(c) applying a negative voltage to a cathode in said evacuated chamber, and a positive voltage to an anode, while feeding into the chamber a flow of a nonreactive gas;

(d) feeding into a chamber a flow of oxygen, thereby causing ferrous ferrite and metallic iron to be deposited on the walls of the chamber to form a film by a sputtering process;

(e) stopping the supply of said nonreactive gas and oxygen to the chamber and of voltage to the electrodes;

(f) releasing vacuum on the chamber and removing the film;

(g) annealing the film to form said composite; and (h) magnetically recording information on said composite.

12. The composite of claim 11 in which said target is an iron plate having a cylinder of metallic copper embedded therein, whereby a mixture of ferrous and cuprous ferrite film is formed by the sputtering process.

13. The composite of claim 11, wherein said film is annealed in an oven for 5 to 60 minutes at 200 to 600 degrees Celsius.

14. The composite of claim 11, wherein said cathode is a heated filament.

15. The composite of claim 11, wherein said chamber is evacuated to a pressure below about $10^{-6}$ mmHg prior to feeding said nonreactive gas thereof.

16. The composite of claim 15, wherein said chamber is maintained at an absolute pressure of below about 0.01 mmHg while feeding into the chamber a flow of a nonreactive gas.

17. A method of forming a composite having particles of metallic iron embedded in a matrix selected from the group consisting of ferrous ferrite, cuprous ferrite, and mixtures thereof, produced according to a method comprising the steps of:
  (a) placing into a chamber at least one sputtering target comprising iron, at least one sputtering target comprising iron and copper, or both a copper sputtering target and an iron sputtering target;
  (b) evacuating said chamber;
  (c) applying a negative voltage to a cathode in said evacuated chamber, and a positive voltage to an anode, while feeding into the chamber a flow of a nonreactive gas;
  (d) feeding into the chamber a flow of oxygen, thereby causing ferrous ferrite and metallic iron to be deposited on the walls of the chamber to form a film by a sputtering process;
  (e) stopping the supply of said nonreactive gas and oxygen to the chamber and of voltage to the cathode and the anode;
  (f) releasing vacuum on the chamber and removing the film; and
  (g) annealing the film to form said composite.

18. A component for magnetic and electrical applications comprising a composite including a matrix selected from the group consisting of ferrous ferrite, cuprous ferrite and mixtures thereof, said matrix having embedded therein particles of metallic iron, said particles of metallic iron being present in said composite at a volume fraction of about 0.01 to about 0.5 and having a diameter ranging from about 10 to about 5000 Angstrom units, wherein said component is exposed to a high-frequency alternating magnetic field.

19. The component according to claim 16 in which the ferrite matrix is crystalline and the particles of metallic iron have a volume fraction ranging from 0.01 to 0.3.

20. A magnetized composite comprising a matrix selected from the group consisting of ferrous ferrite, cuprous ferrite and mixtures thereof having embedded therein particles of metallic iron, said particles of metallic iron being present in said composite at a volume fraction of about 0.01 to about 0.5 and having a diameter ranging from about 10 to about 5000 Angstrom units.

* * * * *